US011495720B2

(12) United States Patent
Wu

(10) Patent No.: US 11,495,720 B2
(45) Date of Patent: Nov. 8, 2022

(54) HEAT DISSIPATION STRUCTURE OF DOOR LEAF OF LED DISPLAY BOX

(71) Applicant: Shenzhen Chip Optech Co. Ltd., Shenzhen (CN)

(72) Inventor: XiaoGang Wu, Shenzhen (CN)

(73) Assignee: Shenzhen Chip Optech Co. Ltd., Shenzhen (CN)

( * ) Notice: Subject to any disclaimer, the term of this patent is extended or adjusted under 35 U.S.C. 154(b) by 140 days.

(21) Appl. No.: 16/997,574

(22) Filed: Aug. 19, 2020

(65) Prior Publication Data

US 2021/0057625 A1 Feb. 25, 2021

(30) Foreign Application Priority Data

Aug. 21, 2019 (CN) .......................... 201910773869.2

(51) Int. Cl.
*B60Q 1/06* (2006.01)
*H01L 33/64* (2010.01)
(Continued)

(52) U.S. Cl.
CPC .......... *H01L 33/648* (2013.01); *G09F 9/3026* (2013.01); *H01L 27/156* (2013.01);
(Continued)

(58) Field of Classification Search
CPC .......... G09F 9/3026; G09F 9/33; G09F 19/22; G09F 9/30; H01L 27/156; H01L 33/648;
(Continued)

(56) References Cited

U.S. PATENT DOCUMENTS 9,301,435 B2 * 3/2016 Kang ................. H05K 7/20972
2008/0078733 A1 * 4/2008 Nearman .............. G09F 9/3026
211/189
(Continued)

FOREIGN PATENT DOCUMENTS

CN 202067477 U * 12/2011 ........... G09F 9/3026
WO WO-2016127613 A1 * 8/2016 ............ F24F 12/006

*Primary Examiner* — Omar Rojas Cadima
(74) *Attorney, Agent, or Firm* — Novoclaims Patent Services LLC; Mei Lin Wong

(57) ABSTRACT

A heat dissipation structure of the door leaf of an LED display box, comprising a box frame (100) and a box door leaf (200), a heat collection cavity (300) is simultaneously formed in the box frame (100) and on the backs of the LED display modules, when working, a number of the LED display modules are energized and emitting light, and the light is irradiated forward, and the heat generated by the operation of the LED display modules is concentrated in the heat collection cavity (300), the box door leaf (200) comprises an outer door leaf plate (210) and an inner lining board (220), wherein the inner lining board (220) is arranged on the inner side (211) of the outer door leaf plate (210), and at the same time, a ventilation and heat dissipation channel (400) is formed between the inner lining board (220) and the outer door leaf plate (210), the ventilation and heat dissipation channel (400) is in communication with the heat collection cavity (300), the ventilation and heat dissipation channel (400) comprises an air inlet (410) and an air outlet (420), wherein the air inlet (410) is in communication with the heat collection cavity (300), and the air outlet (420) is arranged on the outer door leaf plate (210), the box heat source part (500) is fixedly connected to the inner side (221) of the lining board, and at the same time, the box heat source part (500) is located in the heat collection cavity (300).

11 Claims, 5 Drawing Sheets

(51) Int. Cl.
   *G09F 9/302* (2006.01)
   *H01L 27/15* (2006.01)
   *H01L 33/48* (2010.01)
   *H05K 1/02* (2006.01)
   *H05K 7/20* (2006.01)

(52) U.S. Cl.
   CPC ......... *H01L 33/483* (2013.01); *H05K 1/0201* (2013.01); *H05K 7/20* (2013.01); *H05K 7/20972* (2013.01)

(58) Field of Classification Search
   CPC ................ H01L 33/483; H05K 1/0201; H05K 7/20972; H05K 7/20; H05K 7/20145; H05K 7/202; H05K 7/206; H05K 7/20736; H09F 9/3026; F21V 29/50
   See application file for complete search history.

(56) References Cited

U.S. PATENT DOCUMENTS

2011/0019414 A1\* 1/2011 Jiang .................... G09F 9/33
                                                              362/249.02
2016/0324040 A1\* 11/2016 Bouissiere ......... H05K 7/20972

\* cited by examiner

HEAT DISSIPATION STRUCTURE OF DOOR LEAF OF LED DISPLAY BOX

FIELD OF THE INVENTION

The invention relates to a heat dissipation structure, in particular to a heat dissipation structure applied in the door leaf of an LED display box.

PRIOR ART

The LED display screen is a flat panel display assembled by several small LED modules, and is used to display text, images, videos and video signals. At present, LED display screens have been widely used in many fields such as outdoor advertisement displaying and product image displaying. In the specific use, the staff will generally assemble several small LED display screens together to form a large integrated display screen to display text, images, video and other information. This large integrated display screen can improve the size of the display screen so as to improve the effect of displaying and showing.

In practice, in order to expand the display range and display size of the LED display screen, users will greatly increase the number of small LED module panels. When a large number of LED module panels are assembled together, the centralized heat dissipation becomes a thorny issue. Traditional products often have many problems such as product failure and premature aging due to poor heat dissipation. This is the main disadvantage of traditional technology.

SUMMARY OF THE INVENTION

The first object of the present invention is providing a heat dissipation structure of the door leaf of an LED display box, wherein the main heating components of the LED display screen are concentratedly arranged in the heat source part of the box.

When working, the air in the ventilation and heat dissipation channel flows in from the air inlet and then flows out from the air outlet. During this process, part of the heat generated by the operation of the box heat source is directly transferred to the heat collection cavity. Then the airflow in the ventilation and heat dissipation channel is used for ventilation and heat dissipation. The other part of the heat generated by the heat source of the box is directly transferred to the lining board, and then the lining board is ventilated and cooled by the airflow.

In a preferred embodiment, the heat dissipation structure of the door leaf of an LED display box, comprising a box frame (100) and a box door leaf (200), wherein the box frame (100) comprises an outer frame (110) and a connecting frame (120), the outer frame (110) is fixedly arranged around the connecting frame (120), a plurality of LED display modules are fixedly connected to the connecting frame (120), and the backs of the LED display modules uniformly face the rear of the box frame (100), the LED display modules are installed in the box frame (100) by the connecting frame (120), a heat collection cavity (300) is simultaneously formed in the box frame (100) and on the backs of the LED display modules, when working, a number of the LED display modules are energized and emitting light, and the light is irradiated forward, and the heat generated by the operation of the LED display modules is concentrated in the heat collection cavity (300), the box door leaf (200) has two states: open and closed, when the box door leaf (200) is in the open state, the heat collection cavity (300) is opened, at this moment, a number of the LED display modules are exposed, when the box door leaf (200) is in the closed state, the heat collection cavity (300) is closed, at this moment, the heat collection cavity (300) is sealed and waterproofed by the box door leaf (200), the box door leaf (200) comprises an outer door leaf plate (210) and an inner lining board (220), wherein the inner lining board (220) is arranged on the inner side (211) of the outer door leaf plate (210), and at the same time, a ventilation and heat dissipation channel (400) is formed between the inner lining board (220) and the outer door leaf plate (210), the ventilation and heat dissipation channel (400) is in communication with the heat collection cavity (300), the ventilation and heat dissipation channel (400) comprises an air inlet (410) and an air outlet (420), wherein the air inlet (410) is in communication with the heat collection cavity (300), and the air outlet (420) is arranged on the outer door leaf plate (210), the inner lining board (220) comprises an inner side (221) and an outer side (222), and the ventilation and heat dissipation channel (400) is located between the outer side (222) of the inner lining board and the inner side (211) of the outer door leaf plate (210), the box heat source part (500) is fixedly connected to the inner side (221) of the lining board, and at the same time, the box heat source part (500) is located in the heat collection cavity (300).

In a preferred embodiment, wherein, the air in the ventilation and heat dissipation channel (400) flows in from the air inlet (410), and then flows out from the air outlet (420), during this process, part of the heat generated by the operation of the heat source part (500) of the box is directly transferred to the heat collection cavity (300), and then the airflow in the ventilation and heat dissipation channel is used for ventilation and heat dissipation, the other part of the heat generated by the operation of the heat source part (500) of the box is directly transferred to the lining board (220), and then the lining board (220) is ventilated by the airflow in the ventilation and heat dissipation channel (400). In a preferred embodiment, wherein, an air inlet channel (700) is formed between the liner board (220) and the outer door leaf (210), and is communicated with the heat collection cavity (300), the air inlet channel (700) comprises an inlet (710) and an outlet (720), wherein the inlet (710) is arranged on the outer door leaf plate (210), and the outlet (720) is arranged on the lining board (220), the airflow flows in the air inlet channel (700), and at the same time the lining plate (220) can be ventilated and cooled.

In a preferred embodiment, wherein, the inlet (710) opens downward and is recessed in the outer door leaf plate (210).

In a preferred embodiment, wherein, the two door leaves (200) of the box are pivotally connected to the two sides of the box frame (100) respectively. In a preferred embodiment, wherein, the box heat source part (500) is centrally provided with a power supply for the LED display, a power supply box, and a control circuit board. In a preferred embodiment, wherein, the outer door leaf plate (210) and the inner lining board (220) are parallel to each other, so that the air in the ventilation and heat dissipation channels (400) can flow smoothly.

In a preferred embodiment, wherein, a fan (610) is provided at the air inlet (410), and the fan (610) is fixed on the inner side (211) of the outer door leaf plate (210) through the frame cover (611).

In a preferred embodiment, wherein, the heat source part (500) of the box is fixed on the inner side (221) of the lining board by a fixing bar (620).

In a preferred embodiment, wherein, the air outlet (420) opens downward and is recessed in the outer door leaf plate (210).

In a preferred embodiment, wherein, the outer door leaf plate (210) is provided with a waterproof rubber strip (630) around it, and the outer door leaf plate (210) is also provided with a lock (640).

DETAILED DESCRIPTION OF THE INVENTION

As shown in FIGS. 1 to 5, a heat dissipation structure for a door leaf of an LED display box includes a box frame 100 and a box door leaf 200, wherein the box frame 100 includes an outer frame 110 and a connecting frame 120.

The outer frame 110 is fixedly arranged around the connecting frame 120.

Figure 1:
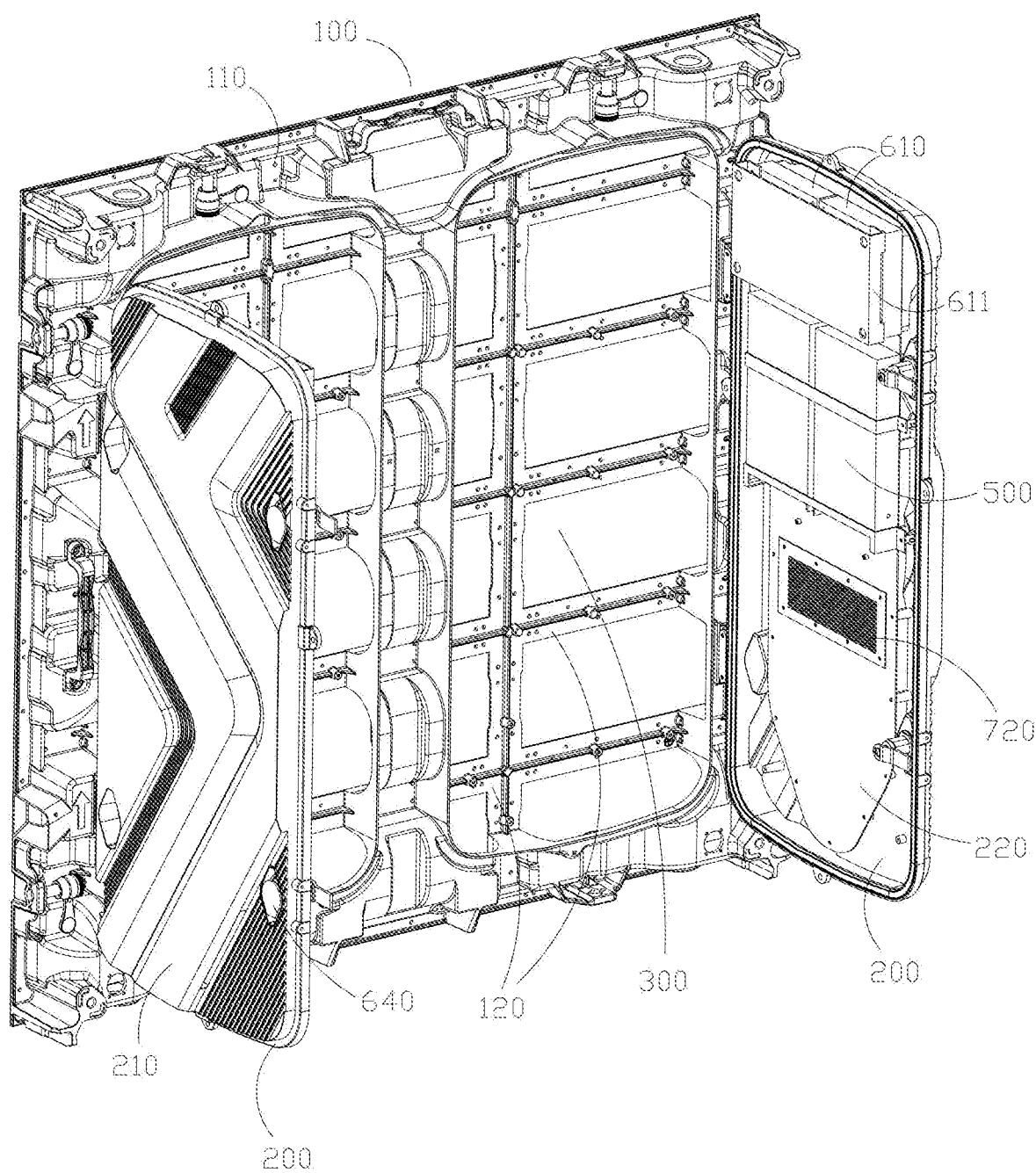
FIG. 1 is a perspective view of the present invention.
Figure 2:
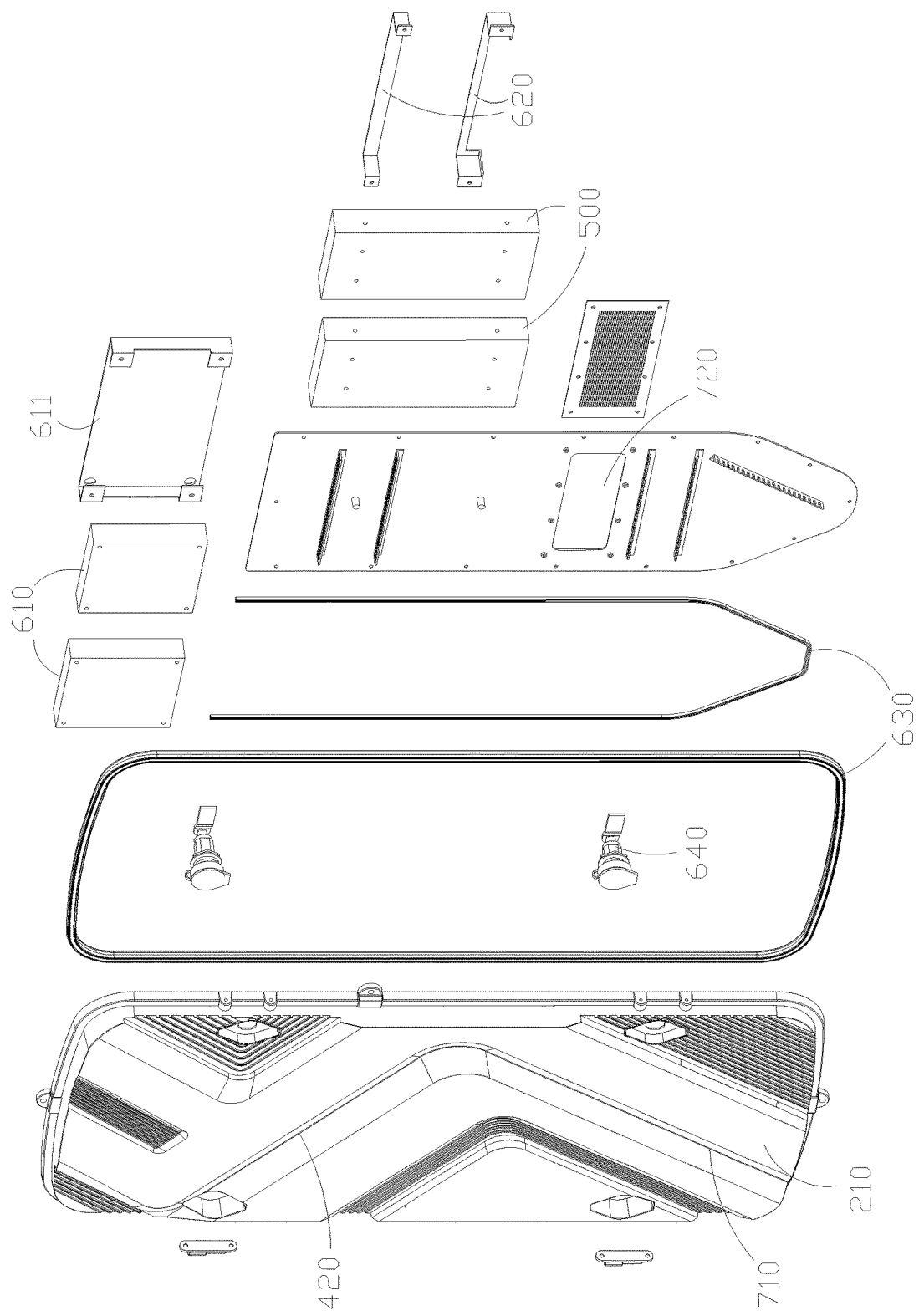
FIG. 2 is an exploded perspective view of the door leaf of the box of the present invention.
Figure 3:
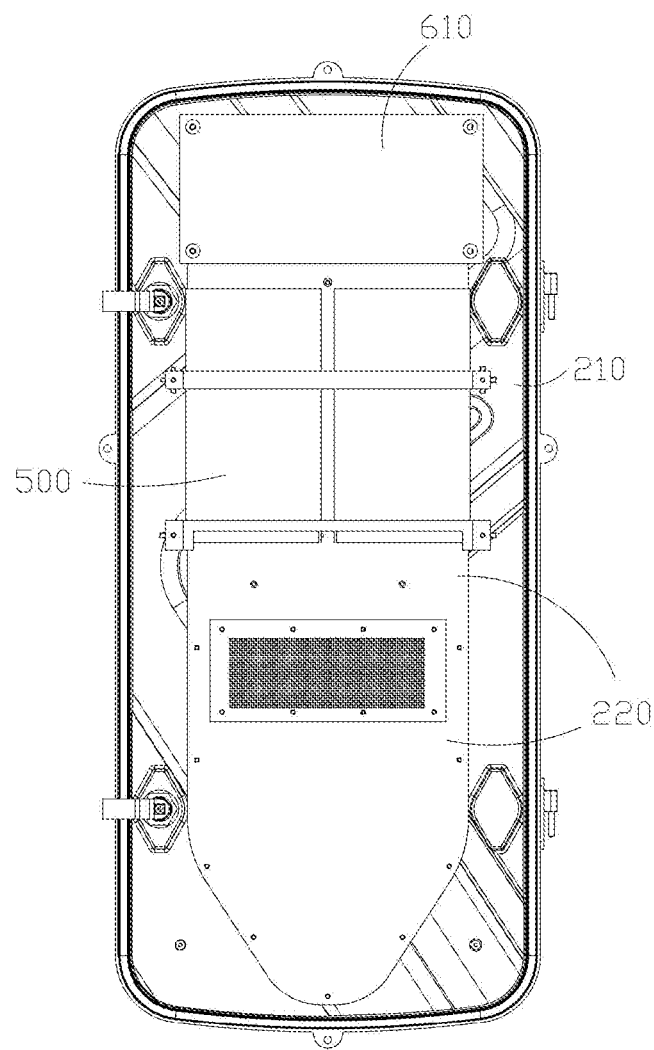
FIG. 3 is a rear view of the door leaf of the box of the present invention.

As shown in FIG. 1, a plurality of LED display modules are fixedly connected to the connecting frame 120, and the backs of the LED display modules are uniformly facing the rear of the box frame 100.

A number of the LED display modules are installed in the box frame 100 by the connecting frame 120.

A heat collection cavity 300 is simultaneously formed in the box frame 100 and on the backs of the LED display modules.

During operation, a number of the LED display modules are energized and emitting light, and the light is irradiated forward, and the heat generated by the operation of the LED display modules is mainly concentrated in the heat collection cavity 300.

The box door leaf 200 is pivotally connected to the box frame 100. In specific implementation, two box door leaves 200 are pivotally connected to the two sides of the box frame 100 respectively.

As shown in FIG. 1, the box door leaf 200 has two states: open and closed. When the box door leaf 200 is in the open state, the heat collection cavity 300 is opened. At this moment, a number of the LED display modules are exposed to facilitate inspection and maintenance. When the box door 200 is in the closed state, the heat collection cavity 300 is closed. At this moment, the heat collection cavity 300 is closed, sealed, waterproofed and protected by the box door leaf 200.

Figure 4:
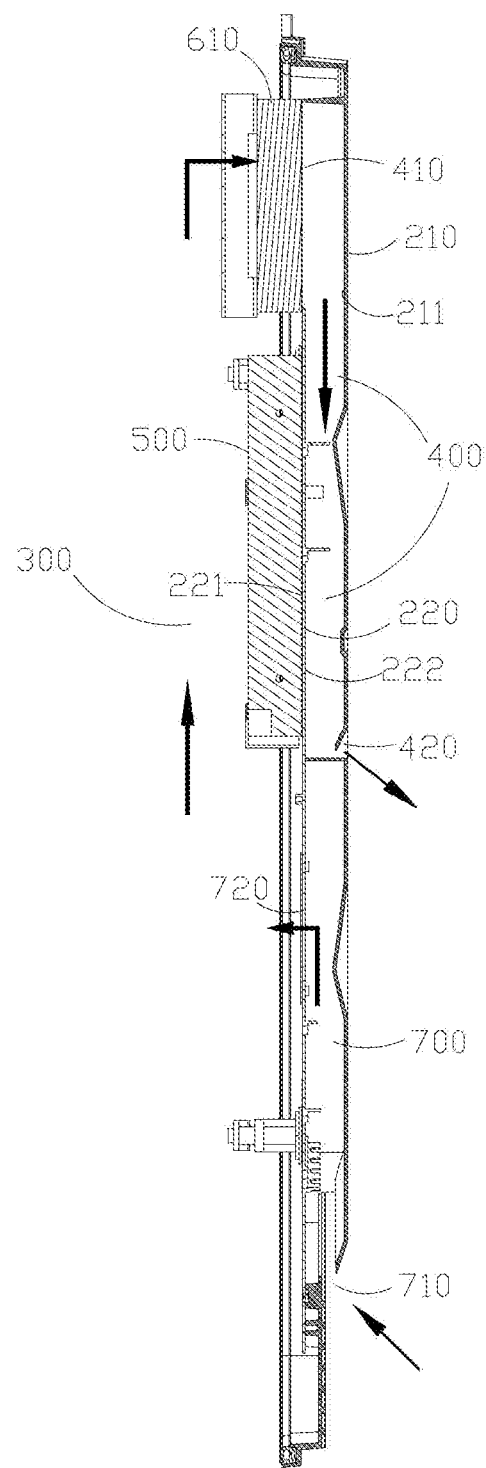
FIG. 4 is a cross-sectional view of the door leaf of the box of the present invention.
Figure 5:
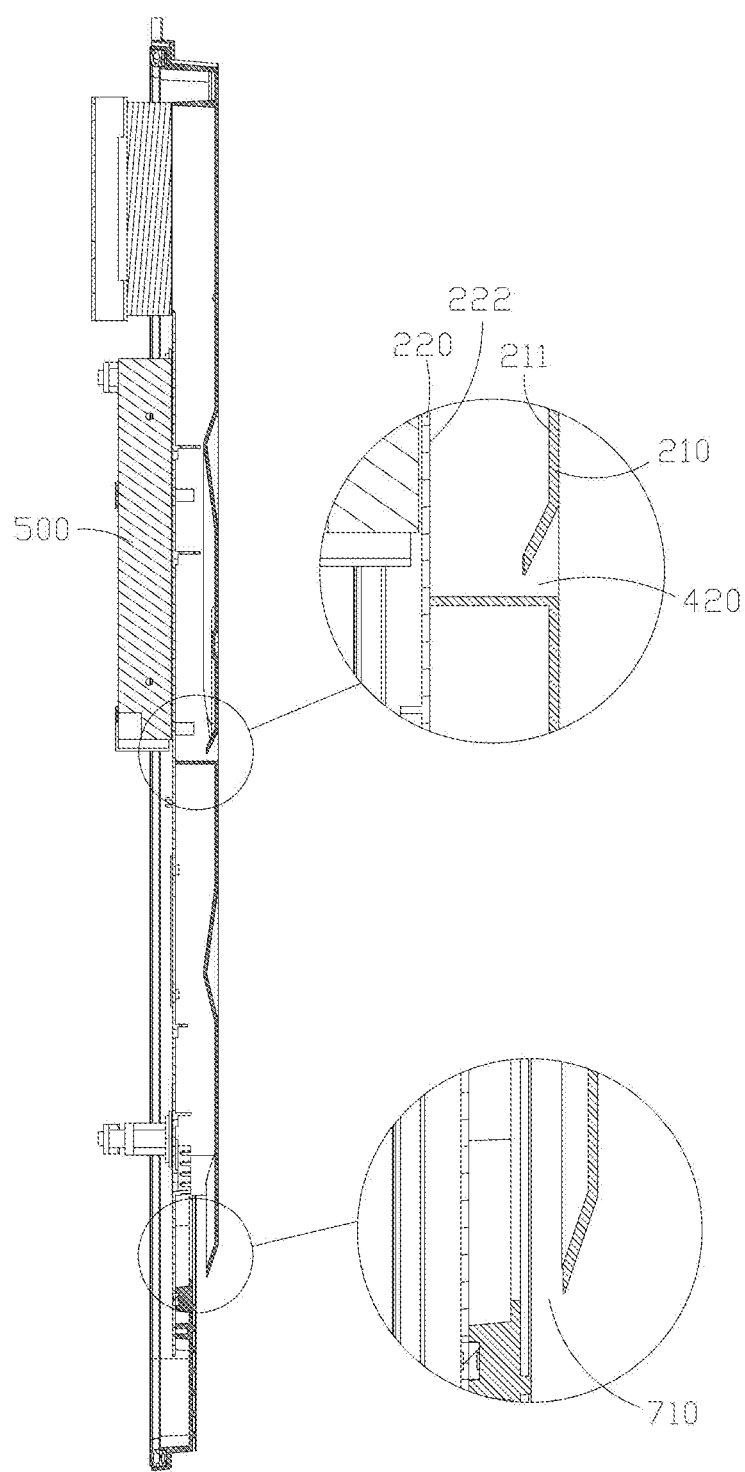
FIG. 5 is a schematic diagram of the air outlet and air inlet of the present invention.

As shown in FIG. 4, the box door leaf 200 includes an outer door leaf plate 210 and an inner lining board 220, wherein the inner lining board 220 is arranged on the inner side 211 of the outer door leaf plate 210, at the same time, a ventilation and heat dissipation channel 400 is formed between the inner lining board 220 and the outer door leaf plate 210.

The ventilation and heat dissipation channel 400 is communicated with the heat collection cavity 300.

The ventilation and heat dissipation channel 400 includes an air inlet 410 and an air outlet 420, wherein the air inlet 410 is in communication with the heat collection cavity 300, and the air outlet 420 is arranged on the outer door leaf plate 210.

The inner lining board 220 includes an inner side 221 and an outer side 222, and the ventilation and heat dissipation channel 400 is located between the outer side 222 of the lining board and the inner side 211 of the outer door leaf plate 210.

The box heat source part (500) is fixedly connected to the inner side 221 of the lining board, and at the same time, the box heat source part 500 is located in the heat collection cavity 300.

In the specific implementation, the heat source part 500 of the box is centrally provided with electronic components with large heat generation such as the power supply of the LED display screen, the power supply box, the control circuit board, the driving part, and the like.

As shown by the arrow in FIG. 4, when working, the airflow in the ventilation and heat dissipation channel 400 flows in from the air inlet 410, and then flows out from the air outlet 420. In this process, part of the heat generated by the operation of the box heat source 500 is directly transferred to the heat collection cavity 300. Then the airflow in the ventilation and heat dissipation channel is used for ventilation and heat dissipation channel 400.

The other part of the heat generated by the heat source 500 of the box is directly transferred to the lining board 220, and then the lining board 220 is ventilated and cooled by the airflow in the ventilation and heat dissipation channel 400.

In a specific implementation, the outer door leaf plate 210 and the inner liner plate 220 are parallel to each other, so that the airflow in the ventilation and heat dissipation channel 400 can flow smoothly.

In a specific implementation, a fan 610 is provided at the air inlet 410 to increase the speed of the airflow in the ventilation and heat dissipation channel 400.

The fan 610 is fixed on the inner side 211 of the outer door leaf plate 210 through a frame cover 611.

In a specific implementation, the box heat source 500 is fixed on the inner side 221 of the lining board by a fixing strip 620.

In a specific implementation, the air outlet 420 opens downwards and is recessed in the outer door leaf plate 210 to achieve a waterproof effect.

As shown in FIG. 4, during specific implementation, an air inlet channel 700 is formed between the liner board 220 and the outer door leaf 210, and is communicated with the heat collection cavity 300. The air inlet channel 700 includes an inlet 710 and an outlet 720, wherein the inlet 710 is arranged on the outer door leaf plate 210, and the outlet 720 is arranged on the lining board 220. The airflow flows in the air inlet channel 700, and at the same time the lining plate 220 can be ventilated and cooled.

In the present invention, by installing the inner lining board 220 on the inner side 211 of the outer door leaf plate 210, the ventilation and heat dissipation channel 400 and the air inlet channel 700 can be formed at the same time. The overall structure is simple, and the ventilation and heat dissipation effect of the inner lining board 220 is excellent.

The inlet 710 has the same structure as the air outlet 420, and the inlet 710 opens downward and is recessed in the outer door leaf panel 210 to achieve a waterproof effect.

In a specific implementation, a waterproof rubber strip 630 is arranged around the outer door leaf plate 210, and a lock 640 is also arranged on the outer door leaf plate 210.

What is claimed is:

1. A heat dissipation structure of a door leaf of an LED display box, comprising a box frame (100) and a box door leaf (200) pivotally connecting to the box frame (100), wherein the box frame (100) comprises an outer frame (110) and a connecting frame (120), the outer frame (110) is fixedly arranged around the connecting frame (120), a plurality of LED display modules are fixedly connected to the connecting frame (120), and the backs of the LED display modules uniformly face the rear of the box frame (100), the LED display modules are installed in the box frame (100) by the connecting frame (120), a heat collection cavity (300) is simultaneously formed in the box frame (100) and on the backs of the LED display modules, when working, a number of the LED display modules are energized and emitting light, and the light is irradiated forward, and the heat generated by the operation of the LED display modules is concentrated in the heat collection cavity (300), the box door leaf (200) has two states: open and closed, when the box door leaf (200) is in the open state, the heat collection cavity (300) is opened, at this moment, a number of the LED display modules are exposed, when the box door leaf (200) is in the closed state, the heat collection cavity (300) is closed, at this moment, the heat collection cavity (300) is sealed and waterproofed by the box door leaf (200), the box door leaf (200) comprises an outer door leaf plate (210) and an inner lining board (220), wherein the inner lining board (220) is arranged on the inner side (211) of the outer door leaf plate (210), and at the same time, a ventilation and heat dissipation channel (400) is formed between the inner lining board (220) and the outer door leaf plate (210), the ventilation and heat dissipation channel (400) is in communication with the heat collection cavity (300), the ventilation and heat dissipation channel (400) comprises an air inlet (410) and an air outlet (420), wherein the air inlet (410) is arranged on the inner lining board (220) in communication with the heat collection cavity (300), and the air outlet (420) is arranged on the outer door leaf plate (210), such that an air flows from the air inlet (410) to the air outlet (420) through the ventilation and heat dissipation channel (400) so as to guide the air flowing from the inner lining board (220) to the outer door leaf plate (210), the inner lining board (220) comprises an inner side (221) and an outer side (222), and the ventilation and heat dissipation channel (400) is located between the outer side (222) of the inner lining board and the inner side (211) of the outer door leaf plate (210), the box heat source part (500) is fixedly connected to the inner side (221) of the inner lining board (220), and at the same time, the box heat source part (500) is located in the heat collection cavity (300), wherein the box heat source part (500) is positioned between the air inlet (410) and the air outlet (420), such that when the box heat source part (500) generates heat, the heat is adapted for being transmitted through the inner side (221) of the lining board to the heat dissipation channel (400) so as to dissipate the heat by an air flow passing from the air inlet (410) to the air outlet (420) through the heat dissipation channel (400).

2. The heat dissipation structure of the door leaf of the LED display box according to claim 1, wherein, the air in the ventilation and heat dissipation channel (400) flows in from the air inlet (410), and then flows out from the air outlet (420), during this process, part of the heat generated by the operation of the box heat source part (500) of the box is directly transferred to the heat collection cavity (300), and then the airflow in the ventilation and heat dissipation channel is used for ventilation and heat dissipation, the other part of the heat generated by the operation of the box heat source part (500) is directly transferred to the inner lining board (220), and then the inner lining board (220) is ventilated by the airflow in the ventilation and heat dissipation channel (400) from the air inlet (410) to the air outlet (420).

3. The heat dissipation structure of the door leaf of the LED display box according to claim 2, wherein, an air inlet channel (700) is formed between the inner lining board (220) and the outer door leaf (210), and is communicated with the heat collection cavity (300), the air inlet channel (700) comprises an inlet (710) and an outlet (720), wherein the inlet (710) is arranged on the outer door leaf plate (210), and the outlet (720) is arranged on the inner lining board (220), the airflow flows in the air inlet channel (700) from the inlet (710) to the outlet (720) for guiding the airflow from the outer door leaf plate (210) to the inner lining board (220), and at the same time the inner lining plate (220) can be ventilated and cooled, such that an airflow direction of the ventilation and heat dissipation channel (400) is opposite to that of the air inlet channel (700).

4. The heat dissipation structure of the door leaf of the LED display box according to claim 3, wherein, the inlet (710) opens downward to guide the air flowing upward to the air inlet channel (700) and is recessed in the outer door leaf plate (210).

5. The heat dissipation structure of the door leaf of the LED display box according to claim 1, wherein, two of the box door leaves (200) of the box are pivotally connected to the two sides of the box frame (100) respectively.

6. The heat dissipation structure of the door leaf of the LED display box according to claim 1, wherein, the box heat source part (500) is centrally provided with a power supply for the LED display, a power supply box, and a control circuit board to fixedly connect to the inner side (221) of the inner lining board (220) so as to directly transmit the heat thereto.

7. The heat dissipation structure of the door leaf of the LED display box according to claim 1, wherein, the outer door leaf plate (210) and the inner lining board (220) are parallel to each other to form the ventilation and heat dissipation channels (400) having a uniform width, so that the air in the ventilation and heat dissipation channels (400) can flow smoothly.

8. The heat dissipation structure of the door leaf of the LED display box according to claim 1, wherein, a fan (610) is provided at the air inlet (410) for generating the airflow into the ventilation and heat dissipation channels (400) at the air inlet (410), and the fan (610) is fixed on the inner side (211) of the outer door leaf plate (210) through the frame cover (611).

9. The heat dissipation structure of the door leaf of the LED display box according to claim 1, wherein, the box heat source part (500) is fixed on the inner side (221) of the inner lining board by at least a fixing bar (620).

10. The heat dissipation structure of the door leaf of the LED display box according to claim 1, wherein, the air outlet (420) opens downward to guide the air flowing downward out of the ventilation and heat dissipation channel (400) and is recessed in the outer door leaf plate (210).

11. The heat dissipation structure of the door leaf of the LED display box according to claim 1, wherein, the outer door leaf plate (210) is provided with a waterproof rubber strip (630) around it, and the outer door leaf plate (210) is also provided with a lock (640) to lock the box door leaf (200) when closing.

\* \* \* \* \*